United States Patent
Reese et al.

(10) Patent No.: US 6,906,387 B1
(45) Date of Patent: Jun. 14, 2005

(54) METHOD FOR IMPLEMENTING ELECTROSTATIC DISCHARGE PROTECTION IN SILICON-ON-INSULATOR DEVICES

(75) Inventors: Dirk Alan Reese, Campbell, CA (US); Peter McElheny, Morgan Hill, CA (US); Minchang Liang, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 14 days.

(21) Appl. No.: 10/687,420

(22) Filed: Oct. 15, 2003

(51) Int. Cl.$^7$ .............................................. H01L 23/62
(52) U.S. Cl. ...................... 257/355; 257/173; 257/328; 257/347; 257/356; 257/357; 257/546
(58) Field of Search ................................ 257/173, 174, 257/328, 546, 355–363, 487–496, 347–354, 507

(56) References Cited

U.S. PATENT DOCUMENTS

| 5,811,857 | A | | 9/1998 | Assaderaghi et al. |
| 5,932,918 | A | * | 8/1999 | Krakauer ..................... 257/368 |
| 6,034,397 | A | | 3/2000 | Voldman |
| 6,404,269 | B1 | | 6/2002 | Voldman |

OTHER PUBLICATIONS

Amerasekera et al., "ESD in Silicon Integrated Circuits", Second Edition, John Wiley & Sons, Ltd., 2002, pp. 200–206, 215–216.
Anderson and Krakauer, "ESD protection for mixed-voltage I/O using NMOS transistors stacked in a cascode configuration", Microelectronics Reliability, 39, 1999, pp. 1521–1529.

Duvvury et al., "ESD Design For Deep Submicron SOI Technology", Symposium on VLSI Technology Digest of Technical Papers, 1996, pp. 194–195.
Verhaege et al., "The EDS Protection Capability of SOI Snapback NMOSFETS: Mechanisms and Failure Modes", EOS/ESD Symposium, 1993, pp. 215–219.
Voldman et al., "Electrostatic Discharge Characterization of Epitaxial–Base Silicon–Germanium Heterojunction Bipolar Transistors", EOS/ESD Symposium, 2000, pp. 239–250.
Voldman et al., "Electrostatic Discharge (ESD) Protection in Silicon–on–Insulator (SOI) CMOS Technology with Aluminum and Copper Interconnects in Advanced Microprocessor Semiconductor Chips", EOS/ESD Symposium, 1999, pp. 105–115.
Voldman et al., "Dynamic Threshold Body–and gate–coupled SOI ESD Protection Networks", Journal of Electrostatics, 44, 1998, pp. 239–255.

* cited by examiner

*Primary Examiner*—Andy Huynh
(74) *Attorney, Agent, or Firm*—Morgan, Lewis & Bockius LLP

(57) ABSTRACT

The present invention is a method and apparatus whereby two NMOS or PMOS devices connected in a stacked gate configuration formed on SOI exhibit improved ESD response characteristics. The shared source-drain region between the two devices is formed to have a dopant depth in the shared region that does not extend through the silicon layer to the BOX layer. This provides a common body for the two devices, and thus a single parasitic bipolar transistor is formed between the drain of one NMOS or PMOS device and the source of the second NMOS or PMOS device. Simultaneous snapback occurs for the two devices through the common body. A further embodiment includes a method of forming two or more stacked gate NMOS or PMOS devices on SOI. The method includes protecting the shared source-drain region between two NMOS or PMOS devices during a final doping step and silicide processing.

10 Claims, 8 Drawing Sheets

US 6,906,387 B1

METHOD FOR IMPLEMENTING ELECTROSTATIC DISCHARGE PROTECTION IN SILICON-ON-INSULATOR DEVICES

The present invention relates generally to semiconductor devices, and particularly to electrostatic discharge (ESD) protection in stacked gate semiconductor devices manufactured using silicon-on-insulator (SOI) technology.

BACKGROUND OF THE INVENTION

This invention is especially useful for protecting semiconductor devices from ESD events, and especially for protecting stacked gate metal oxide semiconductor (MOS) devices formed on silicon-on-insulator (SOI) wafers. SOI technology involves the formation of transistors in a thin layer of semiconductor material (e.g., silicon) overlaying a layer of insulating material (e.g., silicon dioxide). Typically, SOI wafers have a sandwich structure with an insulating layer between two silicon layers, one on either side of the insulating layer. A typical insulating layer includes an oxide (e.g., $SiO_2$) and is often referred to in the art as a buried oxide (BOX) layer. SOI devices have a number of advantages over devices formed on bulk silicon, including lower power consumption, higher performance and higher layout density. However, devices formed on SOI wafers are just as susceptible to ESD events as bulk silicon devices.

The silicon layer in a SOI device may initially be undoped or it may be doped uniformly with n- or p-type dopant. In either case, n- or p-type well regions are typically formed in the silicon layer by conventional photolithographic techniques. This process may be repeated to form well regions of the opposite dopant type, wherein the previously formed well regions are protected from being doped during the formation of the opposite dopant-type well regions. A portion of a well region typically forms the body of one or more MOS transistors, with the source and drain region for MOS-type transistors, for example, formed within doped areas at the surface of the well region.

A stacked gate configuration is often used in output buffers, especially when the supply voltage is at a level above the normal operating voltage of the individual MOS devices (e.g., 3.3 volt power supply with 1.8 volt devices). As shown in FIG. 1, an illustrative stacked gate semiconductor device 102 comprises an output pad 104 connected to a PMOS pull-up circuit 106 and a NMOS pull-down circuit 108. The PMOS pull-up circuit is connected to a supply voltage (VccIO) 110 for I/O pins or solder bumps, and the NMOS pull-down circuit 108 is connected to Ground (VssIO) 112. The PMOS pull-up circuit 106 includes two PMOS transistors—a first PMOS transistor (P1) 114 and a second PMOS transistor (P2) 116, each having a separate gate bias (130, 132) and gate (122, 124). The drain of P1 is coupled to the source of P2 at node 142, with the source of P1 coupled to VccIO 110; and the drain of P2 coupled to the output pad 104 through node 138. In this configuration, P2 is in series with P1, and P2 is held at a reference voltage set by the gate bias. In this way, P1 and P2 operate as a voltage divider such that under normal operating conditions neither P1 nor P2 has a voltage across it greater than the standard voltage for the MOS technology node of P1 and P2 (e.g., a typical standard voltage may be 3.3 Volts). Thus, despite a supply voltage (VccIO) of 5 V, P1 and P2 do not individually have a 5 Volt drop across them.

Similarly, the NMOS pull-down circuit 108 includes two NMOS devices, N1 120 and N2 118. The source of N1 120 is coupled to VssIO 112 and the drain of N2 118 is coupled to the output pad 104 through node 138. The drain of N1 120 is coupled to the source of N2 118 at node 144. N2 118 is held at a reference voltage by gate bias 134, and as such N1 and N2 form a voltage divider that limits the voltage across either device to levels in line with normal operating levels for each device. ESD events typically have a greater effect on the NMOS pull-down.

ESD events may take various forms, but essentially they cause a large electrostatic potential to be discharged across a device. ESD is the transient discharge of static charge, which typically arises from human handling or contact with machines. Electrostatic potentials of 4000 Volts or greater may develop on a human body. Any contact by the human body with a grounded object such as an integrated circuit (IC) pin or solder bump can result in an ESD event lasting up 100 nanoseconds (ns), with peak currents greater than 1 ampere. The energy associated with such ESD events often leads to failure of electronic devices and components. The damage is typically thermal in nature and often leads to device or interconnect burnout. Such high currents may lead to on-chip voltages that are high enough to cause oxide breakdown in thin gate MOS processes. If the gate-channel breakdown voltage of a MOS device is exceeded during an ESD event, a hole will be burned through the oxide insulator of the gate and the transistor will be destroyed.

In order to avoid damage from ESD events, preventive measures may be employed to keep an ESD event from occurring in the first place. For example, antistatic coatings may be applied to the device and human handlers may use grounding wrist straps. However, not every ESD event can be prevented. Thus, protection circuits may also be added to a device or IC chip. The problem with such protection circuits is that they use substantial layout area and raise the cost of the device.

One phenomena that affects a device's response to an ESD event is snapback. Snapback is an avalanche breakdown mechanism found in the parasitic bipolar transistors inherent in MOS-type devices. Snapback allows the parasitic bipolar transistor under the MOS devices to reduce the charge and voltage across the MOS gate structures. Snapback for non-SOI devices is well-known in the art as demonstrated in *ESD in Silicon Integrated Circuits,* by Ajith Amerasekera and Charvaka Duvvury (John Wiley & Sons, Ltd, $2^{nd}$ ed., 2002), which is incorporated herein by reference.

None of the aforementioned techniques consistently provide effective and efficient ESD protection in SOI, and a need remains for an improved means of ESD protection in stacked gate devices formed on SOI. A good protection design would be capable of surviving an ESD event and protecting the internal transistors connected to the affected IC pin or solder bump. In addition, such protection would not expand the required layout area for the device, nor would it add to the cost of manufacturing the device.

SUMMARY OF INVENTION

The present invention addresses the aforementioned problems by utilizing the parasitic bipolar characteristics of NMOS and PMOS devices. A shared source-drain region between two stacked gate NMOS or PMOS devices is formed such that the depth of the dopant in the shared region does not extend through the silicon layer to the insulating layer. This allows the two NMOS or PMOS devices to share a common body, and thus a single parasitic bipolar transistor is formed between the drain of one NMOS or PMOS device and the source of the second NMOS or PMOS device. Two or more NMOS or PMOS devices in stacked gate configurations formed on SOI in accordance with embodiments of the present invention exhibit simultaneous snapback. As a result, snapback typically occurs at a lower voltage than for two or more such devices not operating in simultaneous snapback, thereby providing better ESD protection to the devices by allowing the bipolar effect to start earlier during an ESD event.

A further embodiment includes a method for forming two or more stacked gate NMOS or PMOS devices on SOI. Without altering the number of process steps, the method protects the shared source-drain region between two NMOS or PMOS devices during a final doping step and silicide processing. As such, the dopant in the shared region is limited in depth so that it does not extend through the silicon layer to the insulating layer.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
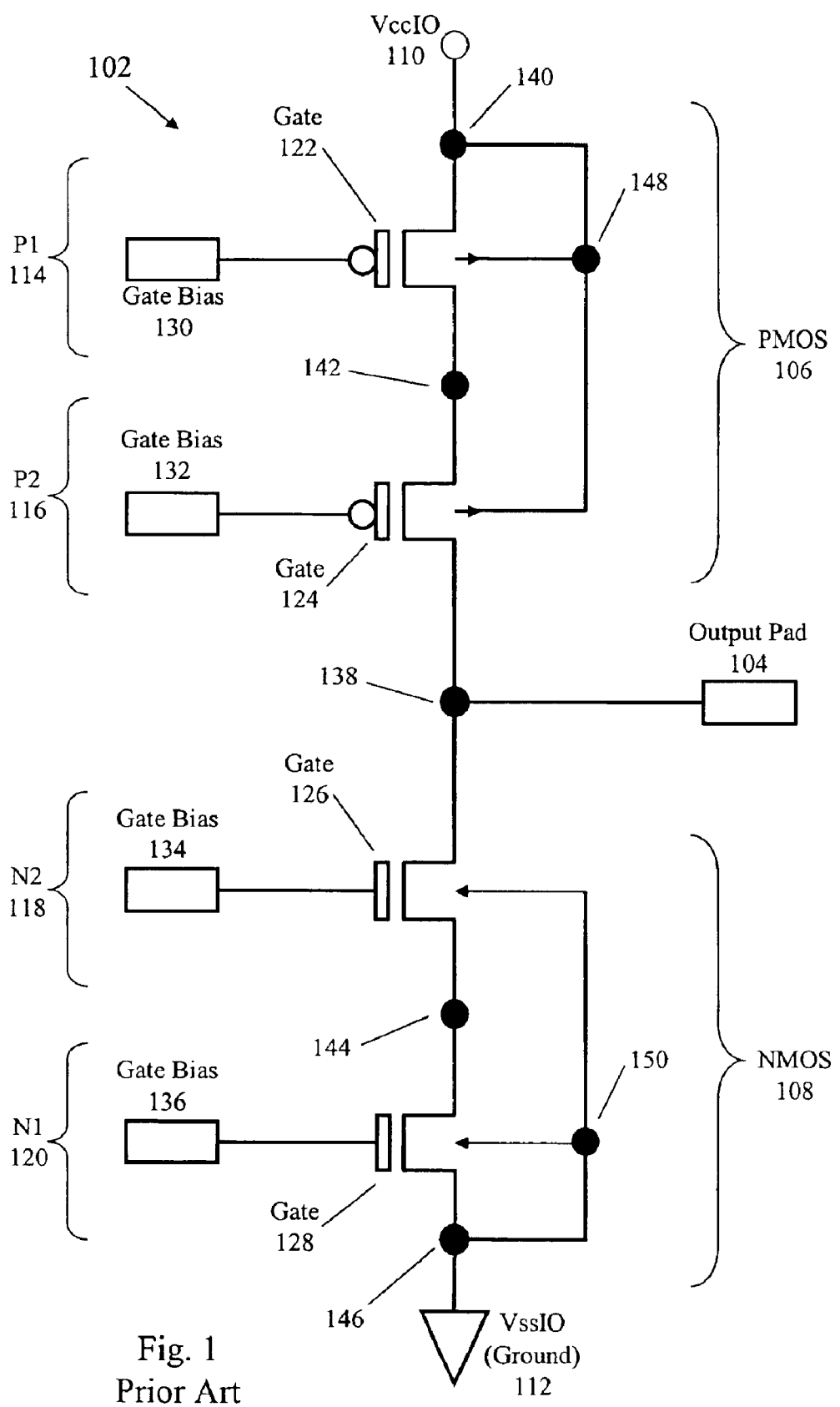
FIG. 1 is a schematic view of a stacked gate output buffer.
Figure 2A:
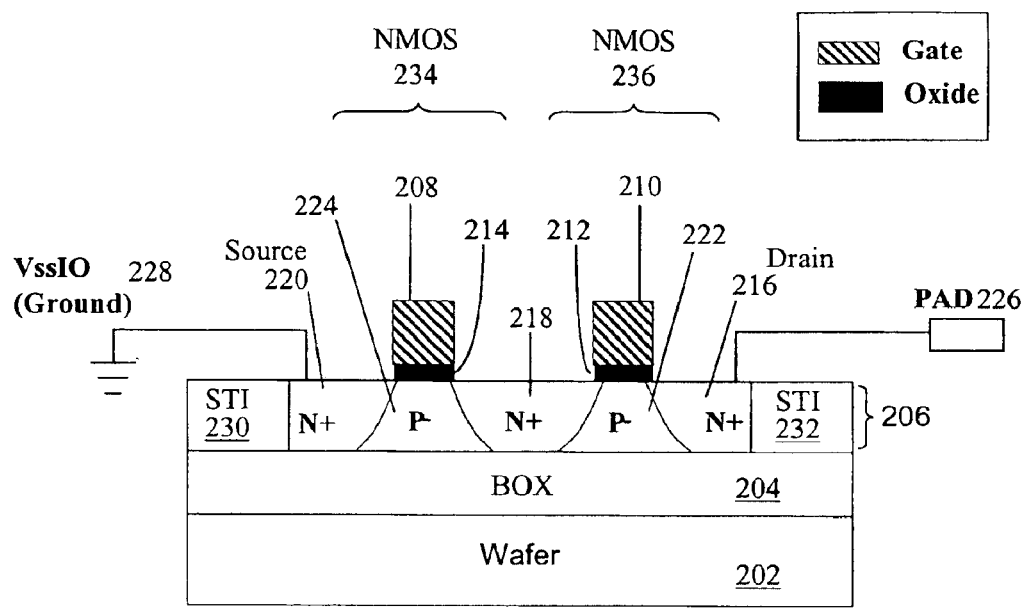
FIG. 2A is a cross-sectional view of a stacked gate NMOS device using silicon-on-insulator (SOI) technology.
Figure 2B:
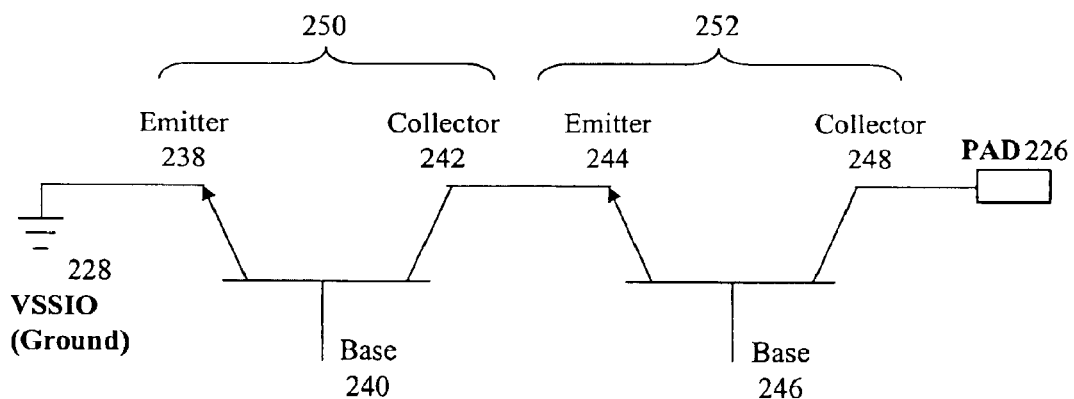
FIG. 2B is a schematic of the parasitic bipolar transistors in the stacked gate NMOS device of FIG. 2A.

Embodiments of the present invention utilize the parasitic bipolar transistors in MOS devices to provide ESD protection to two or more such devices coupled together in series, such as in a stacked gate configuration. As illustrated in FIGS. 2A and 2B, typical prior art stacked gate devices formed on SOI have diffusion regions that extend down to the buried oxide layer, splitting the P– well region into two separate P– regions (222, 224). Thus, two such adjacent MOS devices do not share a common body. As illustrated in FIG. 2A, for example, first and second NMOS transistors 234, 236 in a stacked gate configuration are formed on a wafer 202 (e.g., a silicon wafer) with a buried oxide (BOX) layer 204. The NMOS transistors are formed in the silicon layer 206 above the BOX layer 204, and are isolated from other regions on the wafer by shallow trench isolation (STI) regions 230, 232. NMOS transistor 234 includes a N+ doped source region 220, a P– doped body region 224, an N+ doped drain region 218, and a gate 208. The gate 208 is typically polysilicon and rests on an oxide layer 214. NMOS transistor 236 has a similar configuration, including a N+ doped source region 218, a P– doped body region 222, a N+ doped drain region 216, and a gate 210. The stacked gate configuration includes overlapping the drain of NMOS transistor 234 with the source of NMOS transistor 236 such that both are in N+ doped region 218. The drain region 216 of NMOS transistor 236 is coupled to a pad 226 (e.g., an input-output (I/O) pad or solder bump) and the source region 220 of NMOS transistor 234 is coupled to VssIO (Ground) 228.

In this SOI stacked gate configuration, an ESD event at pad 226 may be dissipated through parasitic bipolar transistors in NMOS transistor 234 and NMOS transistor 236 formed by the PN junctions between P regions 222, 224 and N regions 216, 218, 220. To describe the parasitic bipolar transistors, reference will be made to FIGS. 2A and 2B. In particular, a fist parasitic bipolar transistor 250 has a base 240 that is the P– doped body region 224 of NMOS transistor 234, an emitter 238 that is the N+ doped source region 220, and a collector 242 that is the N+ doped region 218. Similarly, parasitic bipolar transistor 252 has a base 246 that is P– doped body region 222 of NMOS transistor 236, a collector 248 that is N+ doped drain region 216, and an emitter 244 that shares the N+ doped region 218 with collector 242. These two devices are seen by the ESD energy as two separate series connected bipolar transistors (250, 252), because the bodies of the two NMOS transistors are not connected.

Bipolar transistors 250, 252 will provide some ESD protection via individual snapback, but they will not snapback simultaneously. Snapback occurs when the N+ to P– junction at the pad is reversed biased to an extent (e.g., greater than about 0.7 volts) that causes avalanche breakdown which charges up the P– node (i.e. the base in the bipolar device) high enough to cause the bipolar effect. However, for the example shown in FIGS. 2A and 2B, the middle N+ node is floating and will couple up with the P– node, inhibiting the bipolar effect, and thus discouraging snapback.

Figure 3:
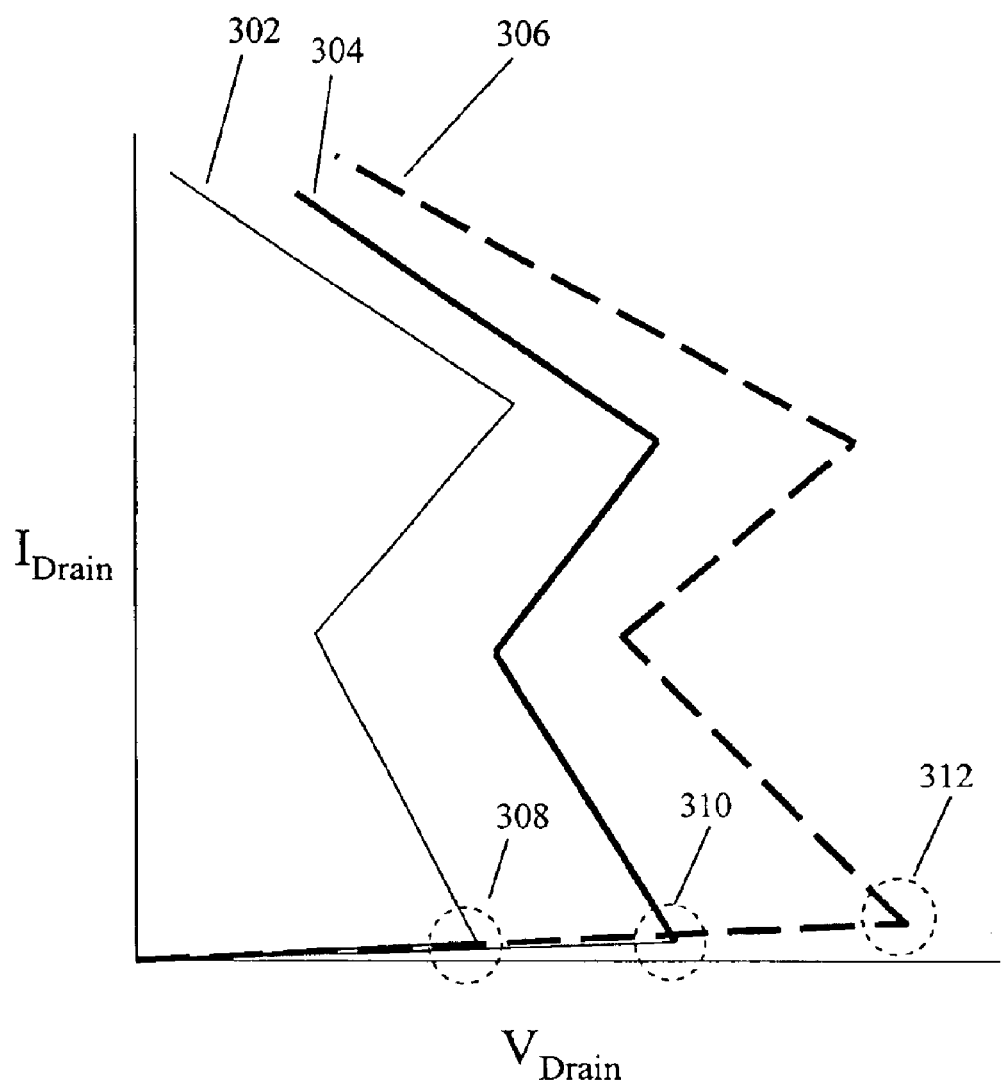
FIG. 3 is a graph of snapback characteristics for a single MOS device and for two stacked gate MOS devices sharing a common body and base.

FIG. 3 illustrates snapback graphs for a single device (302), two devices in simultaneous snapback (304) and two devices in series but not operating in simultaneous snapback. The term "snapback" refers to the phenomena in which the voltage across the drain ($V_{DRAIN}$) stops increasing and the current into the drain ($I_{DRAIN}$) starts rising. The point at which this occurs is shown for each snapback curve (302, 304, 306) by the circled portions 308, 310 and 312, respectively, of the graphs. In relation to snapback for a single device, simultaneous snapback occurs at a higher $V_{DRAIN}$ than for a single device, but at a lower $V_{DRAIN}$ than for two devices not operating in simultaneous snapback. A lower snapback voltage provides better ESD protection, because it allows the bipolar effect to start at a lower $V_{DRAIN}$ level during an ESD event.

The present invention includes a SOI stacked gate semiconductor structure including two or more MOS transistors exhibiting simultaneous snapback during ESD events and a method for forming such structures. Specifically, the SOI structure includes two or more MOS transistors configured such that adjacent MOS transistors have a common body and a shared drain-source region between them. Rather than separate parasitic bipolar transistors associated with each of the MOS transistors, a single parasitic bipolar transistor is formed having a base extending through the common body underneath the MOS transistors' shared drain-source region. The common body is maintained by limiting the depth of the shared drain-source region between the two MOS transistors so that the shared region does not extend through the silicon layer to the BOX layer.

Figure 4A:
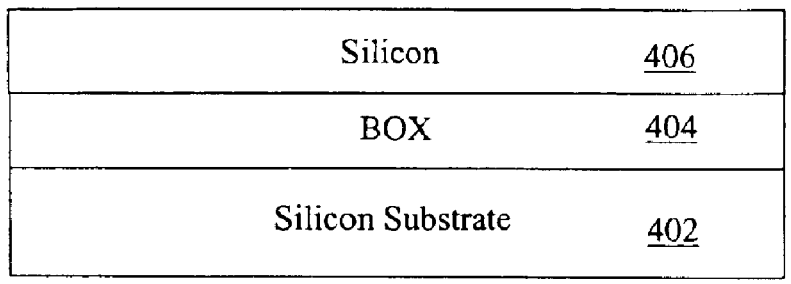
FIGS. 4A–4G are progressive cross-sectional side views illustrating certain aspects of the fabrication of a semiconductor device having electrostatic discharge (ESD) protection according to an embodiment of the present invention.

The fabrication of an embodiment of the present invention is illustrated in FIGS. 4A–4G. Like reference numerals in FIGS. 4A–4G represent like parts. In FIGS. 4A–4G, a NMOS stacked gate device is presented as an example. It will be understood by those skilled in the art that a PMOS stacked gate device has a similar structure but for opposite dopant-types (e.g., an n-type dopant in the PMOS device in place of a p-type dopant in the NMOS device). FIG. 4A illustrates a basic configuration of a SOI wafer. The SOI wafer includes a silicon substrate 402, a buried oxide layer (commonly referred to in the art as a "BOX layer") 404 and a silicon layer 406 on top of the BOX layer. The thickness of the silicon layer above the BOX layer on a typical SOI wafer, for example, may be in a range between about 10 nm and about 100 nm. The BOX layer will typically have a thickness of between about 100 nm and about 500 nm.

Figure 4B:
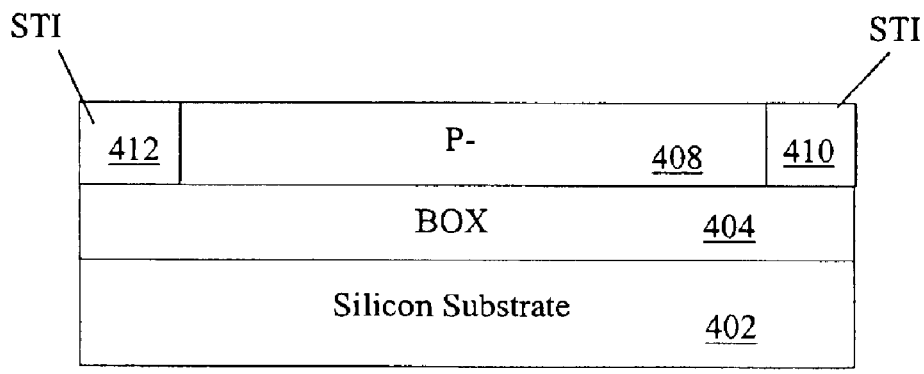

FIG. 4B illustrates the SOI wafer after a region of the silicon layer 406 of FIG. 4A has been doped with, for example, a p-type dopant (e.g. Boron) to form a P− region 408. Two shallow trench isolation (STI) regions 410, 412 have also been formed in the top silicon region. The STI regions 410, 412 typically serve as electrical separators between devices in the top silicon layer. Throughout this illustration, doping and dopants will be understood to include all current and future methods and materials for altering the chemical, physical and/or electrical configuration of a semiconductor region. Such methods may include various ion implantation, diffusion and annealing processes, for example. Dopants may include, for example, gas, liquid, ion or compound forms of boron, phosphorous, arsenic, oxygen, aluminum, antimony, beryllium, gallium, germanium, gold, magnesium, tellurium and tin.

Figure 4C:
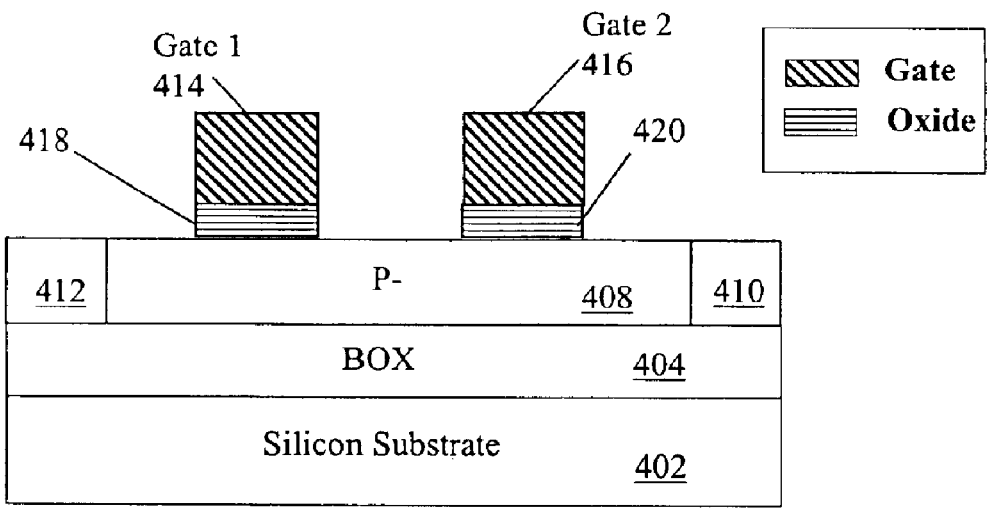

FIG. 4C illustrates the addition of Gate 1 and Gate 2 on top of the P− region 408. Gate 1 and Gate 2 each include an oxide layer 418, 420, respectively, formed on the P− region 408 and polysilicon layers 414, 416, respectively, formed on the oxide layers. Typically, the oxide and polysilicon layers for the gate structures are formed by a conventional photolithographic process including the steps of forming an oxide layer on the P− region 408, depositing a polysilicon layer on the oxide layer, depositing a photoresist layer on the polysilicon layer, exposing the photoresist layer to patterns that define the gate structures and removing the polysilicon and oxide layers from those regions unprotected by the photoresist layer on top of the gate structures.

Figure 4D:
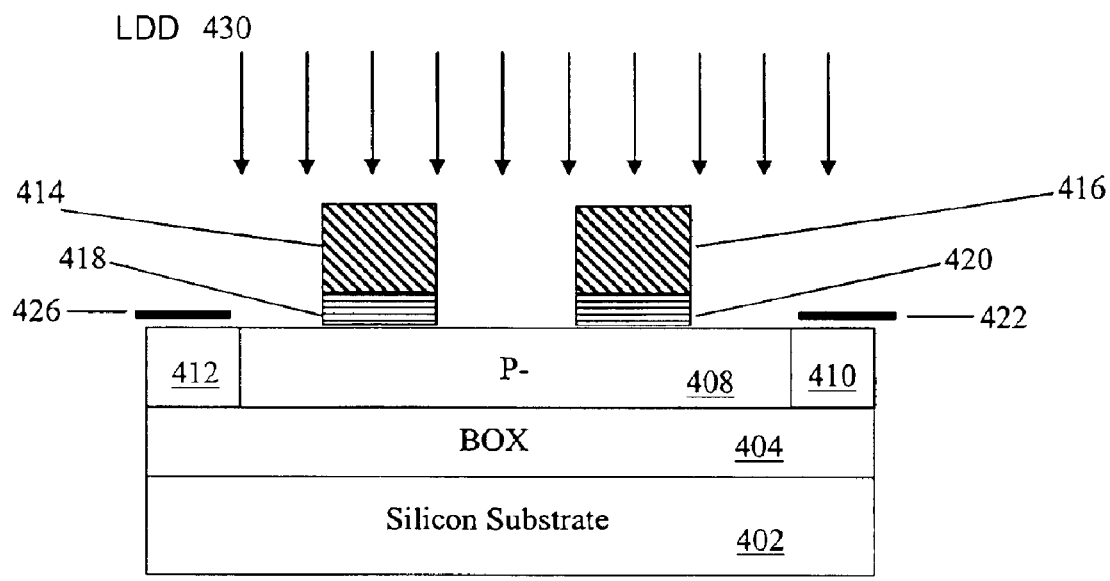

FIG. 4D illustrates a lightly doped drain (LDD) process. A resist layer is deposited on the top surface of SOI wafer and patterned and etched to cover the STI regions 410, 412 and other areas of the SOI wafer surface that are to be protected from the doping process (e.g., adjacent PMOS regions (not shown)). The patterned and etched resist is illustrated here by lines 422 and 426. The doping process in this example of a NMOS device includes an n-type semiconductor dopant 430. Other areas of the SOI wafer surface that may be covered by the resist, for example, may include gate structures and areas of PMOS devices that are not intended to receive an n-type dopant in the NMOS example depicted here. Typically, the gate structures 414 and 416 protect the underlying areas of P− region 408 from receiving dopant materials. However, in an ion implantation doping process, if the dopant impacts the exposed surface of the P− region 408 in a direction that is not perpendicular to the SOI wafer surface, then a portion of the dopant will be found in areas underneath the gate structures. In addition, the dopants will diffuse both laterally and vertically in the silicon during the formation of the transistor. In accordance with the invention, the LDD doping process 430 is controlled, however, such that the n-type dopant diffuses only to a pre-determined depth below the SOI wafer surface and does not extend through the P− region 408 to the BOX layer 404. The depth of the dopant from the LDD doping process will typically be related to the thickness of the silicon layer above the BOX layer. At least for the area of the P− region 408 between Gate 1 and Gate 2, the dopant from the LDD step must not extend down to the BOX layer 404. Typical depths of diffusion will be in a range between about 5% and about 80% of the thickness of the silicon layer. For a silicon layer that is 100 nm thick, for example, the depth of diffusion for the dopant in the LDD process should be in a range between about 5 nm and about 80 nm, and preferably between about 10 nm and about 50 nm. In a silicon layer that is about 10 nm thick, for example, the depth of diffusion for the dopant in the LDD process should be in a range between about 0.5 nm and about 8 nm.

Figure 4E:
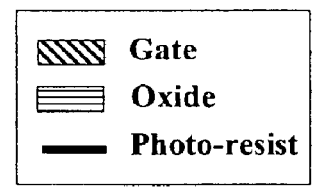
Figure 4E:
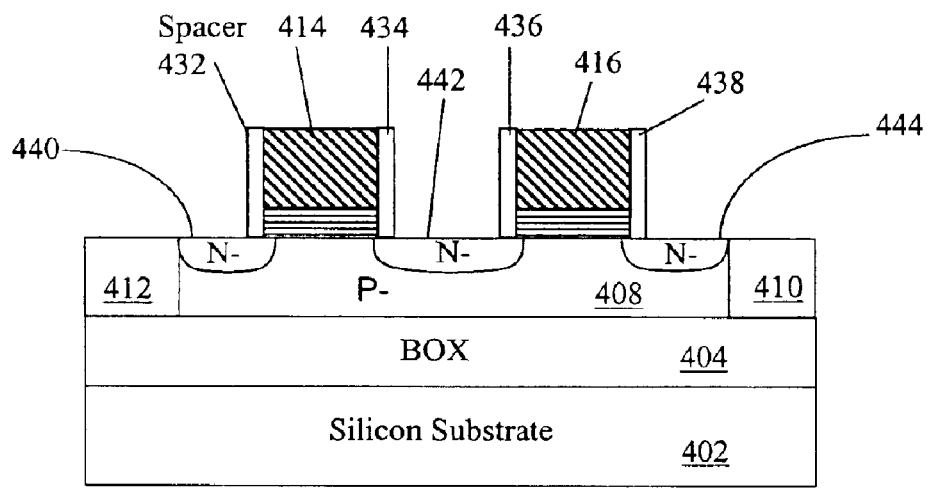

FIG. 4E illustrates the result of the LDD doping process of FIG. 4D and the addition of spacers on the sides of the gates. The LDD doping process results in the formation of N− doped regions 440, 442 and 444 between the STI regions 410, 412 and gate structures 414, 416. In this example, the N− doped regions 440, 442 and 444 each have a depth below the SOI wafer surface that does not extend through the P− region 408 to the BOX layer 404. The size of the center N− doped region 442 is typically limited by the polysilicon gate spacing, although it may also be limited by the size of the opening in a resist layer necessary to allow the dopant to pass through the opening. For the current 90 nm technology node, the spacing between polysilicon lines, such as between the gate structures, is about 0.15 microns ($\mu$m), although this will scale downward with future technology nodes. Thus, the width of the central N− doped region 442 may be about 0.15 microns or less. Mask openings for LDD masks in current technology typically are about 0.4 microns wide, although this too will decrease with future technology nodes. As depicted in this example, the N− dopant has diffused laterally a short distance underneath the gate structures 414, 416.

Spacers 432, 434, 436 and 438 are formed around gate structures 414 and 416 by a deposition and etching process. Spacers are typically made of an oxide, a nitride or a combination of oxide and nitride, and form layers that surround a gate structure and protect the N− regions underneath and immediately adjacent to the gate structures. The spacers may also serve as protection for the gate structures themselves, especially from later metallization steps.

Figure 4F:
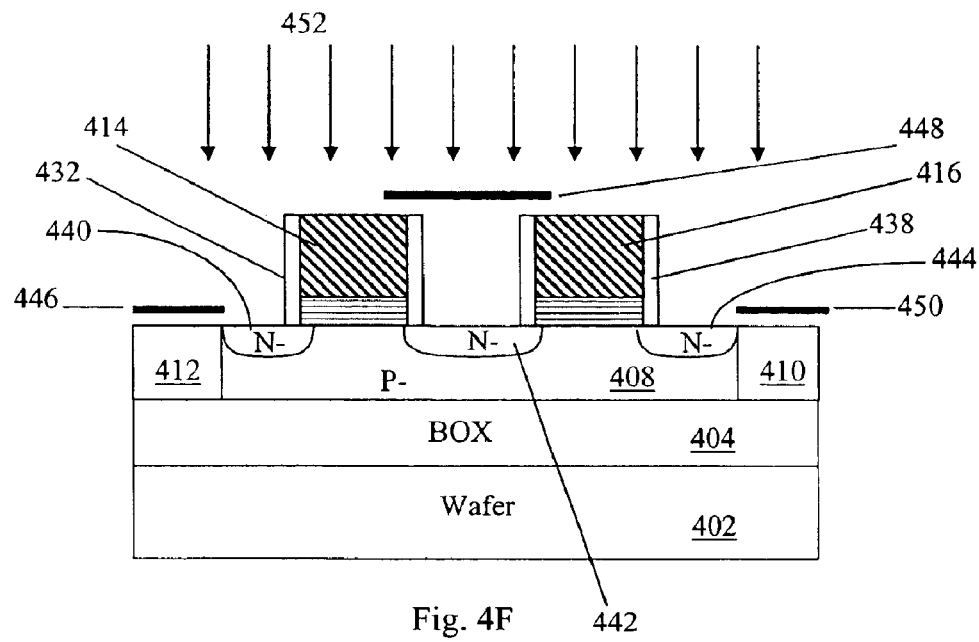

In FIG. 4F, a secondary doping step is illustrated. Typically, an oxide layer (not shown) is formed on the SOI wafer surface and then a photoresist layer is deposited on the oxide layer. The photoresist is then photolithographically patterned, and the photoresist and oxide layers are etched to leave exposed only those areas that are to receive a secondary dopant 452. In this example, the photoresist 446, 448 and 450 and underlying oxide (not shown) cover STI regions 410 and 412 and the center N− region 442 between the gates 414 and 416. The secondary dopants 452 impact only the two outer N− regions 440 and 444. The secondary dopants in this example include an n-type dopant that may be the same as or different from the n-type dopant 430 used in the LDD doping process of FIG. 4D. By protecting the central N− doped region 442, the depth of the central region 442 is limited to the depth resulting from the LDD doping process. Thermal processes may also affect the depth of diffusion, and therefore annealing steps and operating temperatures must also be controlled in order to limit the depth of the central N− doped region 442.

Figure 4G:
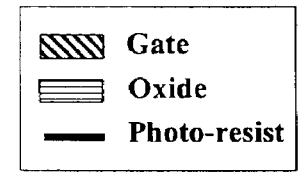
Figure 4G:
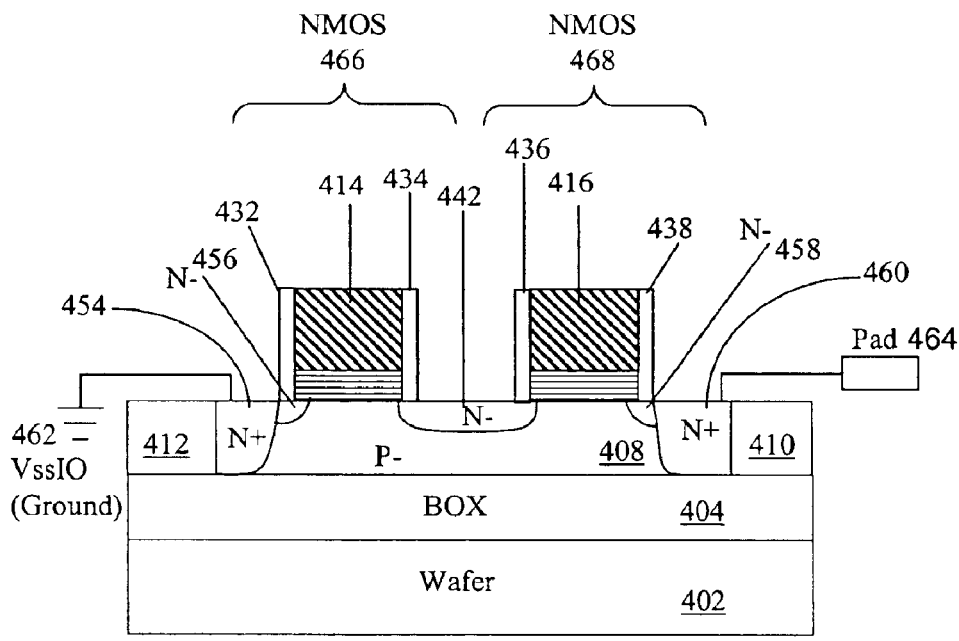

The resulting device is depicted in FIG. 4G. The central N− doped region 442 has a depth that does not extend through the P− doped region 408 to the BOX layer 404. The two outer N− doped regions 440 and 444 of FIG. 4F, after having received the secondary N-type doping shown in FIG. 4F, are now N+ doped regions 454 and 460. N+ doped regions 454 and 460 typically have depths that extend through P− region 408 to the BOX layer 404. By extending through P− region 408 to the BOX layer 404, N+ doped regions 454, 460 have reduced junction capacitances, which is a main benefit of SOI technology. Additionally, spacers 432 and 438 protect N− doped regions 456 and 458 under gates 414 and 416, respectively, during the secondary doping step shown in FIG. 4F. N+ doped region 454 is the source for a first NMOS device 466 including gate 414. N+ doped region 454 is coupled to VssIO 462 (Ground). N+ doped region 460 is the drain for a second NMOS device 468 including gate 416. N+ doped region 460 is coupled to an output pad 464. The center N− doped region 442 functions as both the drain for the first NMOS device 466 and the source for the second NMOS device 468. Silicide (not shown) may be added to the surface of the device to reduce the resistance of the source and drain regions. However, as described below, silicide should not typically be added to the center N− doped region 442.

Figure 5:
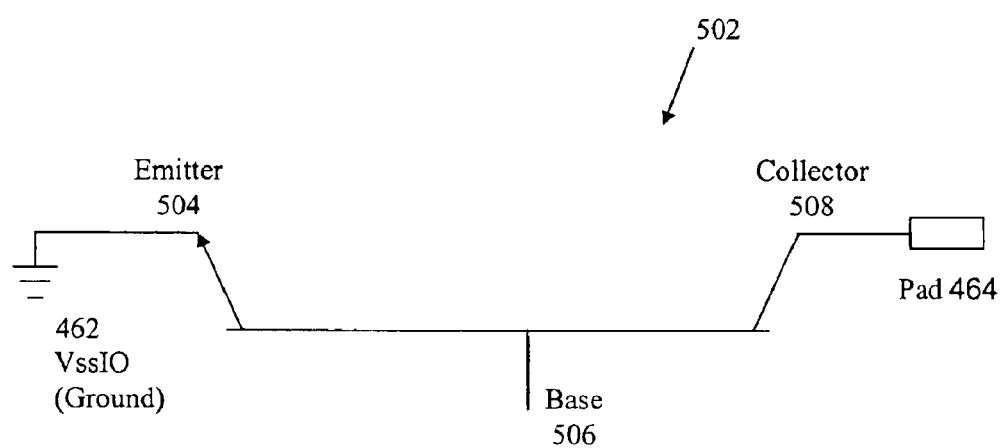
FIG. 5 is a schematic of the parasitic bipolar transistor in the stacked gate NMOS device of FIG. 4G.

FIG. 5 illustrates the parasitic bipolar transistor 502 in the structure of FIG. 4G. To describe the parasitic bipolar transistor 502, reference will be made to FIG. 4G and FIG. 5. The emitter 504 of the parasitic bipolar transistor 502 corresponds to the source region 454 of the first NMOS 466, and as such is coupled to VssIO 462 (Ground). The collector 508 of the parasitic bipolar transistor corresponds to the N+ doped region 460, and as such is coupled to the output pad 464. The base 506 of the parasitic bipolar transistor 502 corresponds to the P− doped region 408. There is a single base 506 between NMOS 466 and NMOS 468, because the two NMOS devices share a common body in the P− doped region 408. The two NMOS devices share a common body, because the center N− doped region 442 is limited in depth such that it does not extend through the P− doped region 408 to the BOX layer 404. Thus, the parasitic bipolar device is formed by the N+ drain region 460 (collector 508) coupled to the pad 464, the P− region 408 (base 506) and N+ source region 454 (emitter 504) coupled to VssIO 462. In this configuration, the single parasitic bipolar transistor 502 allows simultaneous snapback for the two NMOS devices. An ESD event at the pad 464 will cause avalanche breakdown of the PN junction between P− region 408 and N+ region 460, biasing the P− body region 408 to a high enough voltage level above the N+ region 454 at ground to induce simultaneous snapback, thereby discharging the ESD current through the base region before damage can occur to any device attached to the pad 464.

Figure 6:
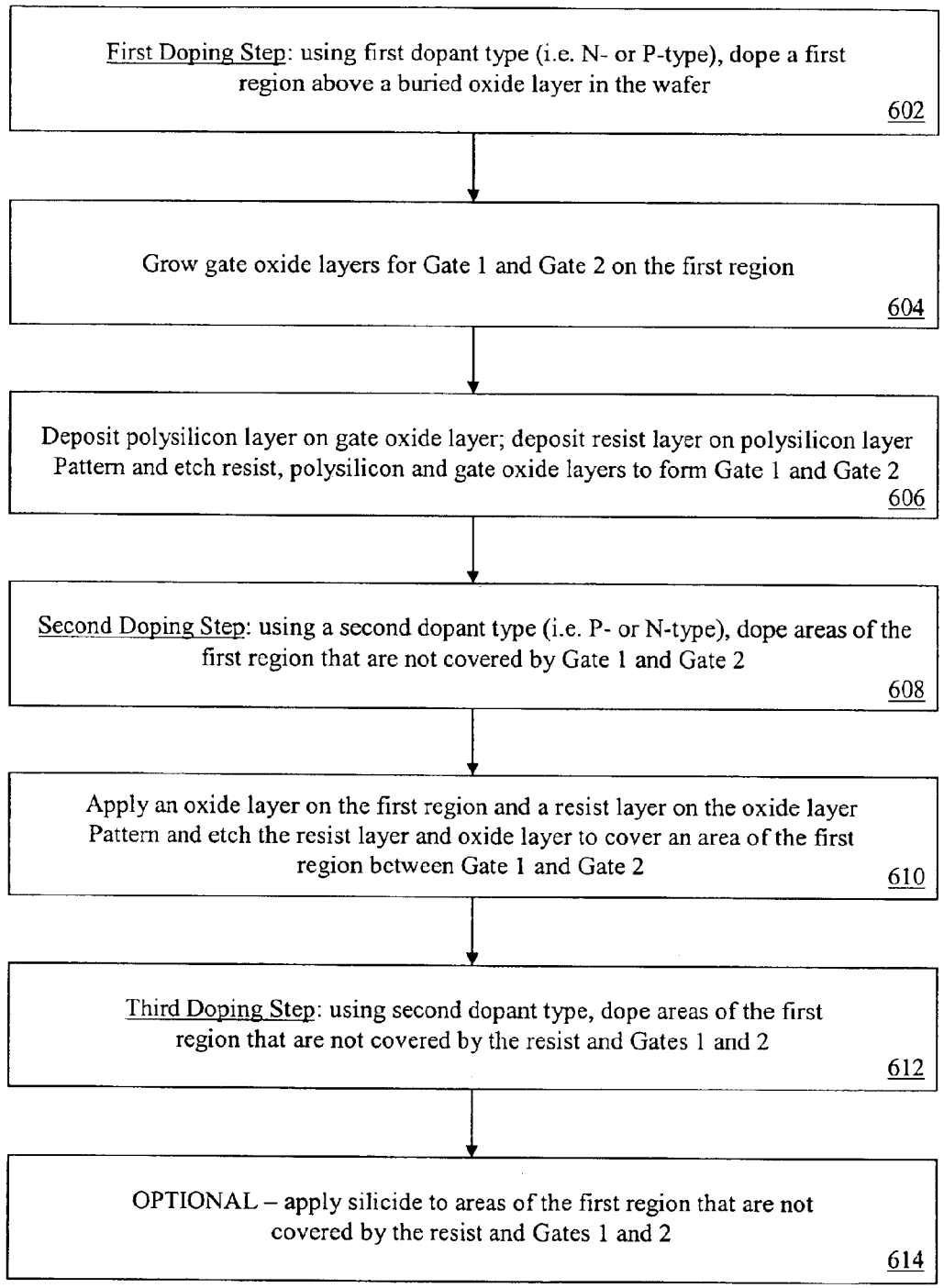
FIG. 6 is a flowchart showing a method of forming a semiconductor device having ESD protection according to embodiments of the present invention.

FIG. 6 is a flowchart further illustrating a method of practicing an illustrative embodiment of the present invention. At step 602, a first doping step is executed by using a first dopant type (i.e. either n-type or p-type) to dope a first region of the silicon layer above a buried oxide (BOX) layer of an SOI wafer. This creates a first doped region. The depth of the first doped region will typically extend through the silicon layer down to the BOX layer. Doping may be by ion implantation, a deposition and thermal diffusion process, or by other doping processes. At step 604, a layer of gate oxide is grown by thermal processing on the surface of the first doped region. At step 606, Gate 1 and Gate 2 are formed by depositing a layer of polysilicon on the oxide layer, lithographically defining a pattern for Gate 1 and Gate 2 in resist on top of the polysilicon layer, and then etching away the layers of polysilicon and oxide in those areas that are not part of Gate 1 and Gate 2.

At step 608, a second doping step is executed using a second dopant type that is different from the first dopant type. For example, if the first dopant was a p-type dopant, then the second dopant is a n-type dopant, or vice versa. This is the LDD doping step. Areas of the first doped region adjacent to Gate 1 and Gate 2 are doped with the second dopant. Gate 1 and Gate 2 protect the areas of the first doped region underneath Gate 1 and Gate 2 from receiving dopant in the second doping step. The second doping step may include lithographically patterning a resist to define the areas adjacent to Gate 1 and Gate 2 that are to receive the second dopant. The second doping step may further include an angled doping process, such that the second dopant diffuses under the edges of Gate 1 and Gate 2. For example, the dopant may be implanted at an angle of between about 45 degrees and 90 degrees relative to the surface plane of the wafer. The second doping step is controlled such that the second dopant does not extend through the silicon layer of the first doped region to the depth of the BOX layer, at least in the region between Gate 1 and Gate 2.

When using ion implantation in the second doping step, the depth of the dopant implant is controlled by controlling the ion dose and energy applied to the ions. For example, in the LDD doping of the second doping step, a typical dose is in a range between about $1 \times 10^{12}$ atoms/cm$^2$ and about $1 \times 10^{14}$ atoms/cm$^2$, with a preferred dose at about $1 \times 10^{13}$ atoms/cm$^2$. The doping energies for LDD doping in the second step will typically be in a range between about 10 KeV to about 100 KeV, with a preferred energy of about 50 KeV. Alternatively, if a deposition and thermal diffusion process is used for the second doping step, then the number of dopant atoms, temperature and time control the dopant depth. The number of atoms is typically specified as atoms per cm$^3$ or atoms per cm$^2$, depending on whether the diffusion is effectively from an infinite source or a limited source, respectively. For example, the number of atoms is in a range between about $1 \times 10^{14}$ atoms per cm$^3$ and about $1 \times 10^{18}$ atoms per cm$^3$, the temperature is in a range between about 900 C and about 1100 C, and the time is in a range between about 30 minutes and about 20 hours.

At step 610, an oxide layer and a resist layer are deposited on the SOI wafer such that the oxide and resist layers cover Gate 1, Gate 2 and the first doped region. A lithography process is used to form a pattern on the resist, and an etching process is used to expose those portions of the first doped region outside of the area of the first doped region between Gate 1 and Gate 2.

A third doping step is executed at step 612. Using a dopant of the second dopant type, the exposed areas of the first doped region are further doped. Typically, the third doping step will cause the dopant applied to the exposed areas to extend through the silicon layer of the first doped region to the BOX layer. When using an ion implant process for the third doping step, the dose and energy used will typically be greater than the dose and energy used in the second doping step. For example, a typical dose for the third doping step is in a range between about $1 \times 10^{14}$ atoms/cm$^2$ and about $1 \times 10^{16}$ atoms/cm$^2$, with a preferred dose at about $3 \times 10^{15}$ atoms/cm$^2$. The doping energies for doping in the third step will typically be in a range between about 30 KeV to about 200 KeV, with a preferred energy of about 70 KeV. If a deposition and thermal diffusion process is used for the third doping step, then the number of dopant atoms per cm$^3$ or per cm$^2$, the temperature and time control the dopant depth and diffusion. These parameters will typically be set at levels higher than for the LDD doping step such that the dopant diffuses deeper into the silicon layer and reaches the underlying insulating layer.

Each doping step may include annealing the device in order to activate the dopant ions in the silicon and to correct any crystalline damage done to the silicon by the implant process. Alternatively, an anneal may be completed after several or all doping steps are completed. Preferably, an anneal is applied after each of the following implants: n-type LDD implant, p-type LDD implant, deeper n+ implants and deeper p+ implants. In either case, a thermal budget is often maintained in order to limit the total amount of heat applied to the device over a given period of time. In an example for a device in the 0.18 micron technology node, a typical thermal budget after the completion of implant steps may include maintaining the temperature in a range between about 900 C and about 1100 C, with a preferred temperature of about 950 C. Anneal times are in a range between about two minutes and about four hours, with a preferred time of about one hour. For spike anneals, such as rapid thermal annealing processes, the anneal time may be less than one minute. For future technology nodes, it is expected that the anneal temperatures will likely remain in substantially the same ranges, but the anneal times will get shorter.

Step 614 is an optional step. Step 614 includes applying a silicide to exposed areas not covered by the resist. Silicide is typically applied to reduce the resistance at the surface of one or more of the doped regions on the SOI wafer. The silicide should not typically be applied to the doped region between Gate 1 and Gate 2, because silicide tends to diffuse or leach into the silicon layer. If silicide is applied to the central region, it may cause the shallow central doped region to diffuse down to the depth of the BOX layer, thereby destroying the common body for the two devices and eliminating simultaneous snapback. Additionally, avoiding the application of silicide in the central region between Gate 1 and Gate 2 reduces the risk of junction leakage and possible junction to body shorting.

By implementing embodiments of the present invention to form a common node shallow junction in the stacked gate devices having simultaneous snapback ESD protection as described above, a separate dedicated ESD protection device is not needed. This saves layout area, and ultimately die/product cost.

While the present invention has been described with reference to a few specific embodiments, the description is illustrative of the invention and is not to be construed as limiting the invention. It should be clear to those skilled in the art that the present invention may apply to other semiconductor devices and device configurations formed on silicon, silicon on insulator or other wafers (e.g., SiGe wafers). Further, other dopant elements and doping processes may be incorporated into the doping steps. Various modifications may occur to those skilled in the art without departing from the true spirit and scope of the invention as defined by the appended claims.

What is claimed is:

1. A semiconductor structure having electrostatic discharge (ESD) protection, comprising:
   an insulating layer;
   a silicon layer on at least one side of the insulating layer;
   a first transistor device formed in the silicon layer, the first transistor device having a source region and a drain region; and
   a second transistor device formed in the silicon layer, the second transistor device having a source region and a drain region;
   wherein
   the first transistor device and the second transistor device are connected in series such that the drain region of the first transistor device and the source region of the second transistor device are in a shared region of the silicon layer;
   the shared region has a depth that does not extend through the silicon layer to the insulating layer; and
   the first and second transistor devices form a single parasitic bipolar device in the silicon layer such that the first and second transistor devices exhibit simultaneous snapback during an ESD event.

2. The structure of claim 1, wherein both the first and second transistor devices are either NMOS transistors or PMOS transistors.

3. The structure of claim 1, wherein the insulating layer comprises a buried oxide layer.

4. The structure of claim 1, wherein the silicon layer has a thickness in a range between about 10 nm and about 100 nm.

5. The structure of claim 4, wherein the shared region has a thickness in a range between about 5% and about 80% of the thickness of the silicon layer.

6. The structure of claim 1, wherein the shared region has a thickness in a range between about 0.5 nm and about 80 nm.

7. The structure of claim 1, wherein both the first and second transistor devices are NMOS transistors each having a polysilicon gate structure above a p-type doped body in the silicon layer and the shared region is an n-type doped region in the silicon layer between the polysilicon gate structures of the NMOS transistors.

8. The structure of claim 7, further comprising a silicide layer on one or more of the n-type doped regions not including the shared region.

9. The structure of claim 1, wherein both the first and second transistor devices are PMOS transistors each having a polysilicon gate structure above a n-type doped body in the silicon layer and the shared region is a p-type doped region in the silicon layer between the polysilicon gate structures of the PMOS transistors.

10. The structure of claim 9, further comprising a silicide layer on one or more of the p-type doped regions not including the shared region.

* * * * *